US006455172B1

(12) United States Patent
Yano et al.

(10) Patent No.: US 6,455,172 B1
(45) Date of Patent: Sep. 24, 2002

(54) LAMINATED RIBBON AND METHOD AND APPARATUS FOR PRODUCING SAME

(75) Inventors: Kentaro Yano, Shimane-ken; Noboru Hanai, Tottori-ken, both of (JP)

(73) Assignee: Hitachi Metals, Ltd., Tokyo (JP)

( * ) Notice: Subject to any disclaimer, the term of this patent is extended or adjusted under 35 U.S.C. 154(b) by 90 days.

(21) Appl. No.: 09/667,724

(22) Filed: Sep. 22, 2000

(30) Foreign Application Priority Data

Sep. 22, 1999 (JP) .......................................... 11-268610

(51) Int. Cl.[7] .................. B32B 15/01; C23C 14/00; C21D 9/46
(52) U.S. Cl. ...................... 428/607; 29/623.3; 118/718; 118/724; 118/725; 118/50; 118/600; 118/75; 118/506; 148/516; 148/527; 148/530; 148/536; 228/18; 228/176; 228/221; 427/124; 427/251; 427/255.5; 427/294; 427/295; 428/615; 428/674; 428/675; 428/680; 428/681; 428/938
(58) Field of Search .................. 428/607, 674, 428/675, 680, 681, 615, 938; 427/124, 251, 255.5, 294, 295; 148/516, 527, 530, 536; 118/718, 724, 725, 50, 600, 75, 506; 228/176, 221, 18; 29/623.3

(56) References Cited

U.S. PATENT DOCUMENTS 4,011,982 A * 3/1977 Marancik ..................... 228/221

5,895,723 A * 4/1999 Utz ........................... 428/480

FOREIGN PATENT DOCUMENTS

| JP | 60-27481 | 2/1985 |
| JP | 1-133689 | 5/1989 |
| JP | 1-224184 | 9/1989 |
| JP | 7-55384 | 6/1995 |
| JP | 7-214344 | 8/1995 |

OTHER PUBLICATIONS

Patent Abstracts of Japan, vol. 016, No. 321 (M–1279), Jul. 14, 1992 & JP 04 091872 A, Mar. 25, 1992, *abstract*.

Patent Abstracts of Japan, vol. 009, No. 152 (M–391), Jun. 17, 1985 & JP 60 027481 A, Feb. 12, 1985, *abstract*.

* cited by examiner

Primary Examiner—Robert R. Koehler
(74) Attorney, Agent, or Firm—Sughrue Mion, PLLC

(57) ABSTRACT

A method for producing a laminated metal ribbon comprises the steps of (a) vapor-depositing a third metal layer on at least one welding surface of a first metal ribbon 4 and a second metal ribbon 5 in a vacuum chamber 1, the third metal being the same as or different from a metal or an alloy of the first and second metal ribbons 4, 5; (b) pressure-welding the first metal ribbon 4 to the second metal ribbon 5; and (c) subjecting the resultant laminate 9 to a heat treatment for thermal diffusion.

5 Claims, 2 Drawing Sheets

(x 400)    50μm

LAMINATED RIBBON AND METHOD AND APPARATUS FOR PRODUCING SAME

BACKGROUND OF THE INVENTION

The present invention relates to a laminated ribbon comprising ribbons strongly welded to each other, and a method and apparatus for efficiently producing such a laminated ribbon.

DESCRIPTION OF PRIOR ART

Japanese Patent Laid-Open No. 7-55384 discloses a method for producing a laminated metal ribbon by pressure-welding metal ribbons by rolling in a vacuum chamber, in which the metal ribbons are activated by ion-etching in a vacuum atmosphere at a room temperature, and the pressure welding is carried out at a low draft ratio in rolling. The first feature of this conventional method is that because the pressure welding is carried out at a room temperature, an alloy layer (diffusion layer) is not easily formed in pressure-welded boundary regions, making it suitable for the production of an extremely thin laminated metal ribbon whose properties are extremely deteriorated by the formation of such an alloy layer (diffusion layer). The second feature of this conventional method is that because the pressure welding is carried out in vacuum, there is no welding defect due to inclusion of a gas and the formation of metal oxides, resulting in a laminated metal ribbon having high welding strength between metal ribbons. Thus, the laminated metal ribbon is excellent in workability.

However, the ion-etching is slow in an etching speed, and etching should be conducted to a degree more than the thickness of an oxide layer o achieve strong welding, resulting in poor in productivity. Further, this method is limited to the production of a two-layer laminated metal ribbon made of the same metal or alloy, failing to produce a laminated metal ribbon having a three or more layer structure.

Japanese Patent Laid-Open No. 1-133689 discloses a hot-rolling method comprising the steps of heating stacked sheets of different metals at a temperature between a room temperature and 1400° C. in vacuum or in a controlled atmosphere, and rolling them to provide the laminated metal ribbon. This conventional method provides high welding strength at a high speed without requiring a welding step, enjoying high productivity. Also, it needs a relatively simple apparatus, thus advantageous in low cost in facility. However, because heating is performed before pressure welding, crease may occur in such a thin metal foil as a copper foil of 10 μm in thickness due to the softening of a thin metal foil and difference in expansion coefficient from another metal foil. Also, it cannot be used without difficulty for the production of coils, poor in productivity.

Also proposed is a low-pressure diffusion welding method. For instance, Japanese Patent Laid-Open No. 60-27481 discloses a method for welding joints comprising the steps of conveying Al and Ti to a cleaning chamber; removing oxide layers formed on their welding surfaces by sputtering (dry etching); conveying them to a position opposing a target means; coating them with Zn, Mg, etc. by sputtering; further forming a coating layer of Si, etc. for preventing the vaporization of Zn, Mg, etc. by sputtering; and conveying them to a diffusion treatment furnace where Al and Ti are welded. Though this method is suitable for the welding of relatively small articles such as joints transportable by a conveyer, it is poor in productivity, because oxide layers are removed from articles to be welded, and two coating layers are formed by sputtering with targets exchanged at least once, and further welding is conducted in a diffusion furnace to which the articles are conveyed. Accordingly, this method is poor in productivity, and it fails to produce continuous laminated metal ribbons without difficulty.

Further, Japanese Patent Laid-Open No. 7-214344 discloses an apparatus for producing a laminate, in which active thin metal layers are formed on a part or all of welding surfaces of three or more sheets simultaneously by sputtering, or contamination layers are removed from them by irradiating beams of an inert gas or metal particles, and the welding surfaces of the sheets are welded to each other. This method is suitable for welding relatively small sheets. However, it is not suitable for the production of continuous laminated metal ribbons.

OBJECT OF THE INVENTION

Accordingly, an object of the present invention is to provide a laminated ribbon constituted by two or more ribbons strongly welded to each other.

Another object of the present invention is to provide a method and apparatus for producing such a laminated ribbon at a low draft ratio efficiently.

SUMMARY OF THE INVENTION

As a result of research on the production of a laminated ribbon having a three or more layer structure by pressure welding in a vacuum chamber, the inventors have found that the productivity of a laminated ribbon is greatly improved by forming a dry-formed film layer on at least one welding surface of ribbons to be welded by a dry film-forming method (vapor deposition method), and that a higher welding strength can be achieved by a heat treatment for thermal diffusion. The present invention has been completed based on these findings.

Thus, the first method for producing a laminated ribbon according to the present invention comprises the steps of (a) forming a dry-formed film layer on at least one welding surface of a first ribbon and a second ribbon in a vacuum chamber, the dry-formed film layer being made of the same material as or a different material from those of the first and second metal ribbons; and (b) pressure-welding the first ribbon to the second ribbon.

In a specific embodiment, the first method for producing a laminated metal ribbon comprises the steps of (a) vapor-depositing a third metal layer on at least one welding surface of a first metal ribbon and a second metal ribbon in a vacuum chamber, said third metal being the same as or different from a metal or an alloy of said first and second metal ribbons; and (b) pressure-welding said first metal ribbon to said second metal ribbon.

The second method for producing a laminated metal ribbon according to the present invention comprises the steps of (a) forming a third metal layer on at least one welding surface of a first metal ribbon and a second metal ribbon by a dry film-forming method in a vacuum chamber, the third metal being the same as or different from a metal or an alloy of the first and second metal ribbons; (b) pressure-welding the first metal ribbon to the second metal ribbon; and (c) subjecting the resultant laminate to a heat treatment for thermal diffusion.

The dry film-forming method is preferably physical vapor deposition method.

The laminated ribbon according to the present invention has a dry-formed film layer between a first ribbon and a second ribbon. In a specific embodiment of the present invention, the laminated metal ribbon has a dry-formed film layer (vapor deposition layer) between a first metal ribbon and a second metal ribbon.

In a preferred embodiment, a diffusion layer is formed in a boundary region between the dry-formed film layer and the first metal ribbon and/or between the dry-formed film layer and the second metal ribbon.

The apparatus for producing a laminated ribbon by pressure-welding ribbons in a vacuum chamber according to the present invention comprises a vacuum chamber comprising (1) a plurality of winding reels for the ribbons; (2) a dry-film-forming means for forming a dry-formed film layer on at least one welding surface of the ribbons taken from the winding reels; (3) rolls for pressure-welding the ribbons with their welding surfaces facing each other; and (4) a winding reel for winding the resultant pressure-welded laminate ribbon.

Guide rolls are preferably disposed at a position opposing the dry-film-forming means. The apparatus for producing a laminated ribbon preferably further comprises a heating means for carrying out a heat treatment for thermal diffusion of the pressure-welded laminate ribbon.

DETAILED DESCRIPTION OF THE PREFERRED EMBODIMENTS

Figure 1A:
FIG. 1(a) is a photomicrograph (x400) showing a cross section of a laminated metal ribbon in EXAMPLE 1.

The important features of the present invention are that ribbons preferably made of metal materials are pressure-welded or -bonded via a film layer dry-formed on the ribbons in a vacuum chamber, and that a heat treatment for thermal diffusion is preferably applied thereto. Though the present invention is most preferably applicable to the pressure welding of metal ribbons via a dry-formed metal film layer, it can be used for the pressure welding of a metal ribbon and a resin ribbon via a dry-formed metal film layer. Detailed explanation will be made below on a combination of two metal ribbons with a dry-formed metal film layer.

A metal dry-formed (for instance, vapor-deposited) in vacuum is so active that it can be pressure-welded to metal ribbons. The welding can be achieved at least by pressing such as rolling, etc. Because it is likely that dry-formed film layer does not provide enough welding strength by pressing, the heat treatment for thermal diffusion is preferably utilized to achieve higher welding strength. If enough welding strength were to be achieved only by rolling, etc., then a higher draft ratio would be required, resulting in crease and deformation. Thus, the heat treatment for thermal diffusion is preferably combined with the pressure welding.

In the present invention, a third metal equal to or different from a first or second metal is deposited as a third metal layer on one or both welding surfaces of the first metal ribbon and the second metal ribbon.

The deposition of the third metal is carried out on either one or both welding surfaces of the first metal ribbon and the second metal ribbon. Even when the third metal is deposited on only one welding surface of the first metal ribbon and the second metal ribbon, sufficient welding strength can be achieved by a subsequent pressure welding, and a higher welding strength can be achieved by depositing the third metal on both welding surfaces of the first metal ribbon and the second metal ribbon.

When the first metal ribbon and the second metal ribbon are made of the same metal or alloy, the same third metal as the first and second metal ribbons provides a uniform laminated metal ribbon. On the other hand, when the third metal is different from the metal or alloy of the first and second metal ribbons, the resultant laminated metal ribbon is suitable for selective etching, etc.

When the third metal is the same as that of the first ribbon or the second ribbon, a laminated metal ribbon composed of two types of metals can easily be obtained. This is applicable to bimetals composed of two metals having different thermal expansion coefficients, leadframes composed of two metals having different thermal electric properties, parts for batteries, etc.

On the other hand, when the first ribbon and the second ribbon are made of different metals or alloys, the third metal may be different from any of the first ribbon and the second ribbon. In such a case, it is possible to obtain a laminated metal ribbon having a three-metal-layer structure. This is applicable to parts for batteries constituted by three metal materials having different corrosion resistance, electric properties and weather resistance, etc.

Figure 1B:
FIG. 1(b) is a schematic view of the photomicrograph of FIG. 1(a)

As is shown in the cross-section photomicrograph of FIG. 1(a) and the schematic view of FIG. 1(b), the laminated metal ribbon 9 of the present invention has as structure in which a third metal layer (dry-formed film layer, specifically, vapor deposition layer) 11 is sandwiched by a first metal ribbon 4 and a second metal ribbon 5.

In the present invention, the third metal layer may be made of the same metal or alloy as that of the first and second metal ribbons, resulting in a laminated metal ribbon composed of substantially one kind of a metal or an alloy. It should be considered that the laminated metal ribbon of the present invention has a structure comprising the third metal layer (dry-formed film layer) sandwiched by the first and second metal ribbons, and that the third metal layer may be made of the same metal or alloy as or a different metal or alloy from that of the first and second metal ribbons. With a heat treatment for thermal diffusion, a diffusion layer is formed between the third metal layer (dry-formed film layer) and the first metal ribbon and/or between the third metal layer and the second metal ribbon. Depending on the conditions of the heat treatment for thermal diffusion, a diffusion layer may extend throughout the dry-formed film layer and the laminated metal ribbon.

In addition to the deposition of the third metal of the same type, different metals or alloys may be deposited on the first and second metal ribbons, and the metal or alloy of the third metal layer (dry-formed film layer) may be different from that of the first and second metal ribbons.

When the third metal layer is thicker than 10 $\mu$m, it takes too long dry-film-forming time, resulting in decrease in productivity. Thus, the third metal layer is preferably 10 $\mu$m or less. When the third metal layer should serve as an etching barrier at the time of selective etching, it may be as thin as 3 $\mu$m or less.

When a thick third metal layer is to be formed, the third metal layer may first be formed on either one or both welding surfaces of the first and second metal ribbons made of the same metal or alloy as that of the third metal layer, and the resultant laminated metal ribbons may be used as first and second metal ribbons. Of course, metal ribbons laminated to the first and second metal ribbons may be used as a third metal layer.

The term "dry film-forming" used herein generally means a dry film-forming method such as physical vapor deposition and chemical vapor deposition, in which a gas phase or plasma is used. The physical vapor deposition includes vacuum vapor deposition; ion plating in which materials are heated in vacuum to evaporate, ionized and accelerated to form a thin film; sputtering in which gaseous ion is impinged on a target to sputter atoms for forming a thin film; and molecular beam deposition in which thin film-forming materials are contained in a special crucible and heated, and evaporated materials are impinged on a metal ribbon in the form of molecular beams to form a thin film thereon. In the chemical vapor deposition, gaseous materials are reacted at a high temperature and deposited on a metal ribbon. The physical vapor deposition such as vacuum vapor deposition, sputtering and ion plating, which has recently made remarkable development in a film-forming speed, is suitable for the deposition of the third metal.

The vacuum vapor deposition is excellent in a deposition speed and thus productivity. The sputtering can be used with a metal having a high melting point as the third metal, leading to a wide range of selection in the third metal. The ion plating is excellent in productivity like the vacuum vapor deposition, capable of providing strong welding of a dry-formed film layer to a substrate ribbon. However, the ion plating needs a bias voltage applied to the metal ribbon, thereby requiring a complicated apparatus.

Thus, in the case of commercial production, vacuum vapor deposition is preferably carried out in a vacuum chamber in a low-pressure atmosphere of $1 \times 10^{-1}$ Pa or less. In this case, with guide rolls positioned opposite the dry-film-forming means, rolls for pressure welding can be fully separated from the dry-film-forming means, thereby suppressing temperature elevation of the rolls and the adhesion of dry-film-forming metals. The guide rolls may be provided with a cooling mechanism.

To facilitate the formation of the dry-formed film layer, an ion-etching treatment may be performed in advance on either one or both of the first metal ribbon and the second metal ribbon.

Next, the first and second metal ribbons provided with a dry-formed film layer are pressure-welded. Continuous pressure welding can be carried out by rolling to provide a continuous ribbon. A draft ratio in rolling is preferably 1% or less. Instead of rolling, the combined metal ribbons may be wound around a winding roll under tension to perform their pressure welding.

With the above pressure welding, it is possible to provide a laminated metal ribbon having a dry-formed film layer between the first metal ribbon and the second metal ribbon, both metal ribbons being well welded.

In a preferred embodiment of the present invention, the laminated metal ribbon may be subjected to a heat treatment for thermal diffusion. This heat treatment for thermal diffusion is suitable to achieve higher welding strength of the laminated metal ribbon. In addition, in the case of selective etching for forming different circuit patterns on the first metal ribbon and the second metal ribbon, the heat treatment for thermal diffusion is suitable for further strengthening a barrier layer.

When ion-etching is carried out as a pre-treatment for a dry film-forming treatment, the degree of ion-etching may be insufficient.

Also, there may be insufficient rolling after the dry film-forming, and the addition of impurities on a dry-formed film layer surface due to a poor degree of vacuum. In these cases, welding may be insufficient after the pressure welding. Even in such cases, high welding can be achieved by the heat treatment for thermal diffusion. The heat treatment for thermal diffusion may be carried out in the same vacuum chamber as used for the dry film-forming or in another heating furnace.

The heating temperature after the pressure welding is preferably about 150–800° C., more preferably 200–400° C., for instance, when Ni is used for the first metal ribbon and Cu is used for the second metal ribbon. The heating is preferably carried out continuously to the ribbons being conveyed in the above vacuum chamber. When a temperature elevation speed is insufficient, the laminated metal ribbon may be taken out of the vacuum chamber and heated in another heat treatment furnace. When heating the laminated metal ribbon being conveyed in the vacuum chamber, a heating means may be provided in a path of conveyance, or the rolls used for pressure welding may be heated.

The laminated metal ribbon thus produced may properly be cut to a desired size.

Because metal ribbons are welded at a low pressure and heated in the present invention, a relatively thin laminated metal ribbon having a thickness of 0.5 mm or less can be preferably produced. Specifically, leadframes constituted by two types of metals of copper/invar alloy, three-layer structural materials of copper/nickel/ copper as circuit materials for fine wiring such as CSP, BGA, etc. are preferably produced by the present invention.

Because various metals or alloys can be welded via dry-formed film layers in the present invention, resins, etc. may be used for the first and second ribbons. For instance, when the first ribbon is made of a resin, and when the second ribbon is made of Cu. Cu may be dry-formed into a thin film layer on either one or both welding surfaces of the first and second metal ribbons, and the two ribbons may be pressure-welded with their welding surfaces facing each other, to provide a laminated ribbon having a layer structure of a first layer (resin)/a dry-formed film layer (Cu)/a second layer (Cu). This laminated ribbon can be used for printed circuit sheets.

The present invention will further be explained referring to the drawings attached hereto.

Figure 2:
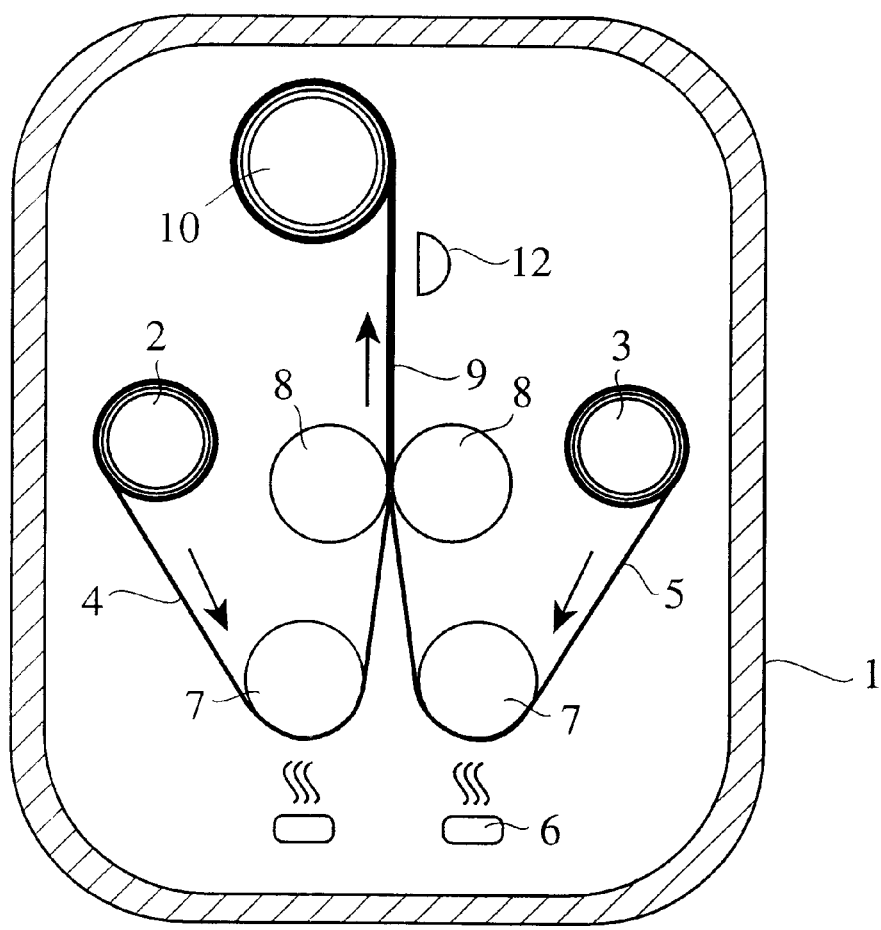
FIG. 2 is a schematic view showing an apparatus for producing a laminated metal ribbon according to one embodiment of the present invention.

FIG. 2 is a schematic view showing an example of the apparatus for producing a laminated metal ribbon according to the present invention. As is shown in FIG. 2, a winding reel 2 and a winding reel 3 are disposed in a vacuum chamber 1, and when the first metal ribbon 4 taken from the winding reel 2 and the second metal ribbon 5 taken from the winding reel 3 pass over guide rolls 7, 7 disposed opposite a dry-film-forming means (for instance, vapor deposition means) 6, a third metal is vapor-deposited on their welding surfaces. The vapor-deposited first and second metal ribbons 4, 5 are pressure-welded by rolls 8, 8 to provide a laminated metal ribbon 9 having a vapor deposition layer 11 between the first and second metal ribbons 3, 4. The resultant laminated metal ribbon 9 is heated by a heating means 12 and then wound by a reel 10.

EXAMPLE 1

A Cu foil of 10 μm in thickness as a first metal ribbon 4 and a Cu foil of 25 μm in thickness as a second metal ribbon 5 were taken from winding reels 2, 3, respectively, and conveyed to a position where their welding surfaces were opposing the vapor deposition means 6 in a vacuum chamber 1 having a vacuum atmosphere of about $5 \times 10^{-3}$ Pa. Ni was deposited on the welding surfaces of the first and second metal ribbons 4, 5 by a vacuum vapor deposition method.

The vapor-deposited surfaces of the first and second metal ribbons 4, 5 were pressure-welded by the rolls 8, 8 to produce a laminated metal ribbon 9 of Cu/Ni/Cu, wherein Ni constituted a vapor deposition layer 11. The resultant laminated metal ribbon 9 was heat-treated for thermal diffusion at 300° C. by a heating means 12, and then wound around a winding reel 10.

The resultant laminated metal ribbon 9 of Cu/Ni/Cu was observed by an optical microscope in its cross section. FIG. 1(a) is a photomicrograph at a magnification of 400, and FIG. 1(b) is a schematic view of the photomicrograph of FIG. 1(a).

It was found that the laminated metal ribbon 9 had a cross-section structure having an extremely uniform third metal layer (vapor deposition layer) 11 sandwiched by the first and second metal ribbons 4, 5. It was confirmed by X-ray analysis that a diffusion layer of Ni constituting the third metal layer (vapor deposition layer) 11 and Cu constituting the first and second metal ribbons 4, 5 was formed in boundary regions between the vapor deposition layer 11 and the first and second metal ribbons 4, 5.

A sample of 10 mm in width cut out of the laminated metal ribbon 9 was subjected to a peeling test that the first and second metal ribbons 4 and 5 were peeled from each other at a speed of 50 mm/minute, to measure a maximum load for peeling. As a result, it was found that the welding strength was 0.1 N/mm in the case of no heat treatment and 0.5 N/mm or more in the case of a heat treatment at 300° C., proving that the heat treatment for thermal diffusion served to increase the welding strength of the laminated metal ribbon 9.

EXAMPLE 2

A stainless steel foil of 60 μm in thickness as a first metal ribbon 4 and a Ni foil of 10 μm in thickness as a second metal ribbon 5 were taken from winding reels 2, 3, respectively, and conveyed to a position where their welding surfaces were opposing a dry film-forming material of Ni disposed in a dry film-forming means 6 in a vacuum chamber 1 having a vacuum atmosphere of about $1 \times 10^{-2}$ Pa. Ni was deposited on the welding surfaces of the first and second metal ribbons 4, 5 by a dry film-forming (vacuum vapor deposition) method.

The vapor-deposited surfaces of the first and second metal ribbons 4, 5 were pressure-welded by the rolls 8, 8 to produce a laminated metal ribbon 9 consisting of stainless steel foil/Ni vapor deposition layer/Ni foil. The resultant laminated metal ribbon 9 for safety valves of batteries was wound around a winding reel 10.

The stainless steel foil of the laminated metal ribbon 9 was selectively etched to form circular holes of 3 mm in diameter in a lattice pattern having a pitch of 10.5 mm. The laminated metal ribbon 9 was then cut by a punch press to obtain 10 laminated metal pieces each 10.5 mm×7.5 mm having one circular hole at a center for safety valve chips of batteries. Each safety valve chip was welded to a high-pressure steel-made container such that it sealed a valve opening of the high-pressure container. With a compressor connected to one end of the container via a pressure gauge, the container was pressurized. As a result, Ni foils in 10 safety valve chips were broken at a pressure of 1.3–1.7 MPa.

Samples were cut out of the safety valve chips to observe their cross sections by an electron microscope. It was thus confirmed that a vapor deposition layer of Ni having a thickness of 1 μm was formed between the first metal ribbon (stainless steel foil) and the second metal ribbon (Ni foil).

As described above, the present invention has made it possible to produce, by a single step in the same vacuum chamber, a laminated metal ribbon having three or more layers that has conventionally been produced by two steps. Also, the present invention has made it easy to carry out ion-etching that is a pre-treatment of dry film-forming (vapor deposition). Thus, the laminated metal ribbon of the present invention can be produced at an extremely improved productivity.

What is claimed is:

1. A laminated metal ribbon having a dry-formed film layer between a first metal ribbon and a second metal ribbon, wherein a diffusion layer is formed in a boundary region between said dry-formed film layer and said first metal ribbon and/or between said dry-formed film layer and said second metal ribbon.

2. A method for producing a laminated metal ribbon comprising the steps of (a) forming a third metal layer on at least one welding surface of a first metal ribbon and a second metal ribbon by a dry film-forming method in a vacuum chamber, said third metal being the same as or different from a metal or an alloy of said first and second metal ribbons; (b) pressure-welding said first metal ribbon to said second metal ribbon; and (c) subjecting the resultant laminate to a heat treatment for thermal diffusion.

3. The method for producing a laminated metal ribbon according to claim 2, wherein said dry film-forming method is a physical vapor deposition method.

4. An apparatus for producing a laminated ribbon by pressure-welding ribbons in a vacuum chamber, said vacuum chamber comprising (1) a plurality of winding reels for said ribbons; (2) a dry-film-forming means for forming a dry-formed film layer on at least one welding surface of said ribbons taken from said winding reels; (3) rolls for pressure-welding said ribbons with their welding surfaces facing each other; and (4) a winding reel for winding the resultant pressure-welded laminate ribbon, further comprising a heating means for carrying out a heat treatment for thermal diffusion of the pressure-welded laminate ribbon.

5. An apparatus for producing a laminated ribbon by pressure-welding ribbons in a vacuum chamber, said vacuum chamber comprising (1) a plurality of winding reels for said ribbons; (2) a dry-film-forming means for forming a dry-formed film layer on at least one welding surface of said ribbons taken from said winding reels; (3) rolls for pressure-welding said ribbons with their welding surfaces facing each other; and (4) a winding reel for winding the resultant pressure-welded laminate ribbon, wherein guide rolls are disposed at a position opposing said dry-film-forming means, further comprising a heating means for carrying out a heat treatment for thermal diffusion of the pressure-welded laminate ribbon.

* * * * *